(12) United States Patent
Chen et al.

(10) Patent No.: US 6,235,637 B1
(45) Date of Patent: May 22, 2001

(54) METHOD FOR MARKING A WAFER WITHOUT INDUCING FLAT EDGE PARTICLE PROBLEM

(75) Inventors: Sheng-Hsiung Chen, Taichung County; Ming-Hsing Tsai, Taipei, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/396,518

(22) Filed: Sep. 15, 1999

(51) Int. Cl.$^7$ .................................................. H01L 21/311
(52) U.S. Cl. .................... 438/694; 438/695; 438/696; 438/697; 438/700; 438/745; 438/712
(58) Field of Search ..................................... 438/694, 695, 438/696, 697, 700, 745, 712

(56) References Cited

U.S. PATENT DOCUMENTS

| | | | |
|---|---|---|---|
| 4,732,646 | 3/1988 | Elsner et al. | 156/626 |
| 4,765,865 | * 8/1988 | Gealer et al. | 156/647 |
| 4,877,481 | * 10/1989 | Fukuda et al. | 156/643 |
| 5,187,601 | 2/1993 | Yamazaki et al. | 359/54 |
| 5,237,343 | 8/1993 | Osada | 346/140 R |
| 5,373,137 | * 12/1994 | McLaughlin | 219/121.68 |
| 5,610,104 | 3/1997 | Mitchell | 437/228 |
| 5,733,711 | * 3/1998 | Juengling | 430/312 |
| 5,851,928 | 12/1998 | Cripe et al. | 438/748 |
| 5,877,064 | 3/1999 | Chang et al. | 438/401 |
| 5,956,596 | * 9/1999 | Jang et al. | 438/401 |
| 6,063,695 | * 5/2000 | Lin et al. | 438/462 |

OTHER PUBLICATIONS

Chi–Shen Lo et al., "Integration Laser Marker for Flat Edge Particle Reduction", SEMI, IC Seminar (1997), pp. 267–278.

* cited by examiner

Primary Examiner—Benjamin L. Utech
Assistant Examiner—Vanessa Perez-Ramos
(74) Attorney, Agent, or Firm—George O. Saile; Stephen B. Ackerman; Willian J. Stoffel

(57) ABSTRACT

A method for marking a semiconductor wafer without inducing flat edge particles, using a laser scribing technique. The process begins by providing a semiconductor wafer having a marking area with a silicon top layer. The semiconductor wafer is coated with a photoresist layer. A volume of the photoresist layer and a volume of silicon top layer are removed corresponding to the intended marking. Optionally, the marking pattern can be further etched into the silicon top layer by anisotropic etching, using the photoresist layer as an etching mask. In another option, the laser scribing process can be set to scribe the marking pattern in the photoresist layer without scribing the silicon top layer. The marking pattern can then be anisotropically etched into the silicon top layer, using the photoresist layer as an etching mask. Alternatively, the photoresist layer can be patterned to form an opening in the photoresist layer over a marking area, thereby exposing the silicon top layer. The silicon top layer is then marked using a laser scribing technique, and the photoresist layer prevents contamination of the device areas of the wafer by the silicon particles generated by the laser scribing technique.

14 Claims, 2 Drawing Sheets

METHOD FOR MARKING A WAFER WITHOUT INDUCING FLAT EDGE PARTICLE PROBLEM

BACKGROUND OF INVENTION

1) Field of the Invention

This invention relates generally to fabrication of a semiconductor device and more particularly to a method for laser marking a wafer without inducing flat edge particles.

2) Description of the Prior Art

Currently, semiconductor wafers are generally marked for identification and traceability. One approach to marking wafers is to cut a mark directly into the silicon layer of the wafer using laser scribing techniques. The mark is made by removing a volume of material from the silicon layer of the wafer. The removal of silicon material creates a silicon slag. As disclosed in an article by Chi-Shen Lo et al. titled "Integration Laser Marker for Flat Edge Particle Reduction", laser marking has been identified as the root cause of reduced yields from what is commonly referred to as flat edge particles. Analysis of the contaminating particles has shown them to be silicon removed by the marking process. A need exists for a method of laser marking semiconductor wafers without inducing flat edge particles.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,610,104 (Mitchell) shows a method for marking a mark on a silicon substrate. This patent teaches a method of laser marking a wafer by forming an insulating layer on the silicon surface, marking the insulating layer by laser scribing, then removing the silicon or oxidized silicon exposed by the laser scribing process using a wet etch process and removing the insulating layer.

U.S. Pat. No. 5,237,343 (Osada) shows a method for scribing ink jet heads.

U.S. Pat. No. 5,877,074 (Chang et al.) shows a method of laser marking a wafer.

U.S. Pat. No. 5,851,928 (Cripe et al.) discloses a method of isotropically etching a substrate.

U.S. Pat. No. 4,732,646 (Elsner et al.) recites a marking method comprising: forming holes in a masking layer, performing a high-energy ion implant, and etching into the substrate.

The article "Integration Laser Marker for Flat Edge Particle Reduction," (Chi-Shen Lo et al.) SEMI, IC Seminar (1997) identifies laser marking as the root cause of the flat edge particle yield reduction, and recites a method of reducing flat edge particle defects by controlling mark position and beam energy.

SUMMARY OF THE INVENTION

It is an object of the present invention to provide a method for laser marking a semiconductor wafer without inducing flat edge particle yield reduction.

It is another object of the present invention to provide a robust and economical method for laser marking a semiconductor wafer without inducing flat edge particle yield reduction.

To accomplish the above objectives, the present invention provides a method for marking a semiconductor wafer without inducing flat edge particles, using a laser scribing technique. The process begins by providing a semiconductor wafer having a marking area with a silicon top layer. The semiconductor wafer is coated with a photoresist layer. A volume of the photoresist layer and a volume of silicon top layer are removed corresponding to the intended marking. Optionally, the marking pattern can be further etched into the silicon top layer by anisotropic etching, using the photoresist layer as an etching mask. In another option, the laser scribing process can be set to scribe the marking pattern in the photoresist layer without scribing the silicon top layer. The marking pattern can then be anisotropically etched into the silicon top layer, using the photoresist layer as an etching mask. Alternatively, the photoresist layer can be patterned to form an opening in the photoresist layer over a marking area, thereby exposing the silicon top layer. The silicon top layer is then marked using a laser scribing technique, and the photoresist layer prevents contamination of the device areas of the wafer by the resulting silicon slag.

The present invention provides considerable improvement over the prior art. A semiconductor wafer can be marked using a laser scribing technique without inducing flat edge particle defects. Particles generated by the laser scribing technique are trapped by the photoresist layer, and are subsequently removed with the photoresist layer.

The present invention provides several advantages over a process using an insulating layer to protect active areas from contamination by silicon slag. Photoresist is less expensive to form than an insulating layer. Without an insulating layer, high temperature processing and pre-cleaning are not required, reducing cycle time and cost. Also, since photoresist is softer and easier to remove than an insulating layer, the method of the present invention is more effective in removing silicon particles generated by the laser scribing process.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for marking a semiconductor wafer without inducing edge particle defects.

First Embodiment

Figure 1:
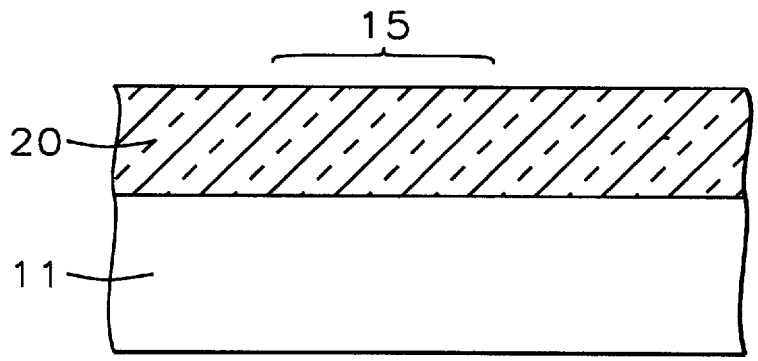
FIGS. 1, 2, 4 & 5 illustrate sequential sectional views of a process for laser marking a semiconductor wafer without inducing flat edge particle yield reduction, according to the present invention.

Referring to FIG. 1, the process begins by providing a semiconductor wafer (11) having a marking area (15). The semiconductor wafer has a silicon surface in the marking area. Semiconductor wafer (11) should be understood to possibly include a substrate comprising a semiconducting material such as silicon or germanium, or a silicon on insulator (SOI) as is known in the art.

Still referring to FIG. 1, a photoresist layer (20) is formed on the semiconductor wafer (11). The photoresist layer (20) preferably has a thickness of between about 1000 Angstroms and 100,000 Angstroms.

Figure 2:
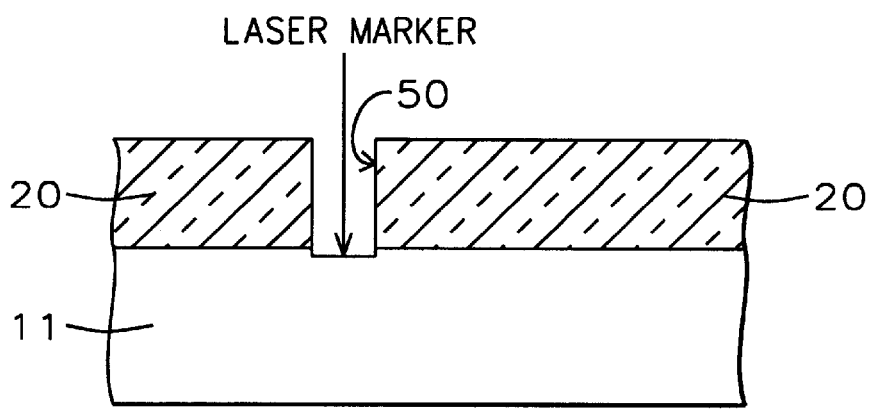

Referring to FIG. 2, a volume of the photoresist layer (20) and the silicon top surface of the semiconductor wafer (11) corresponding to the intended marking pattern are removed using a laser scribing technique to form a laser mark trench (50). The volume of the silicon top surface that is removed preferably has a depth of between about 2000 Angstroms and 100,000 Angstroms, which can be easily controlled during the laser scribing process.

Figure 4:
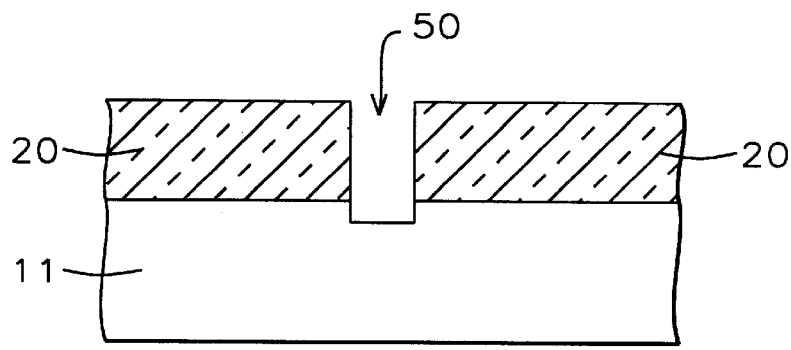

Referring to FIG. 4, the laser mark trench (50) can optionally be formed in the photoresist layer (20) only, then extended to a depth of between about 2000 Angstroms and 100,000 Angstroms below the top surface of the semiconductor wafer (11) adjacent to the marking pattern, by etching the silicon top surface of the semiconductor wafer (11) using the photoresist layer (20) as an etching mask. The silicon top surface is preferably etched using a wet etching process such as KOH.

Figure 5:
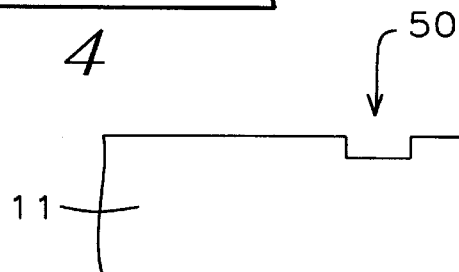

Referring to FIG. 5, the photoresist layer (20) is removed, leaving a semiconductor wafer (11) with a laser marking trench (50) defined by laser scribing, without silicon particle contamination. The photoresist layer (20) can be removed using an ashing process in oxygen as is known in the art.

Figure 3:
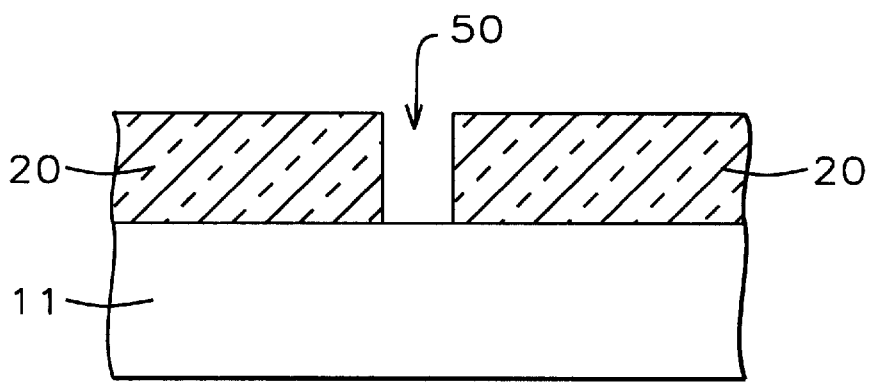
FIG. 3 illustrates a sectional view of an alternate embodiment following the laser cutting step wherein a laser mark (trench) is made in the resist layer, but not in the underlying silicon surface.

Alternatively, the laser scribing process can be set to completely remove the photoresist layer (20) corresponding to the intended marking pattern without removing any volume of the silicon top surface of the underlying semiconductor wafer (11), thereby forming a laser marking trench (50) only in the photoresist resist layer (20) as shown in FIG. 3. The silicon top surface of the the semiconductor wafer is then etched using the photoresist as an etch mask, as described above to extend the laser marking trench (50) into the silicon top surface of the semiconductor wafer (11), and the photoresist layer is removed.

Second Embodiment

Figure 6:
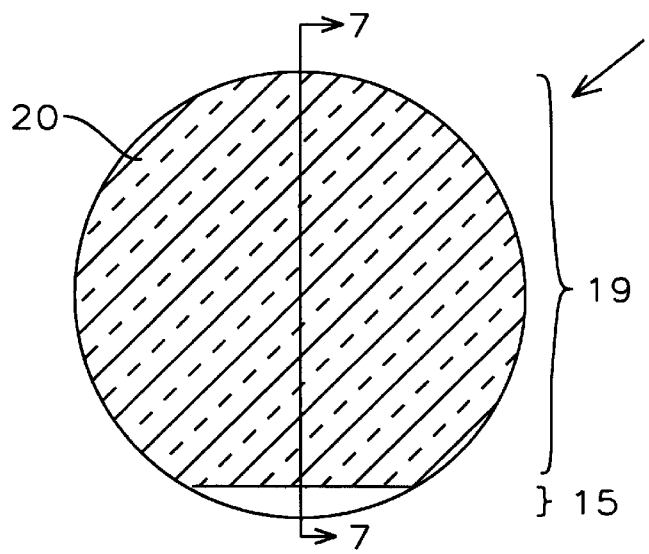
FIG. 6 represents a top view of a semiconductor wafer marked according to a second embodiment of the present invention, following patterning of the photoresist layer.
Figure 7:
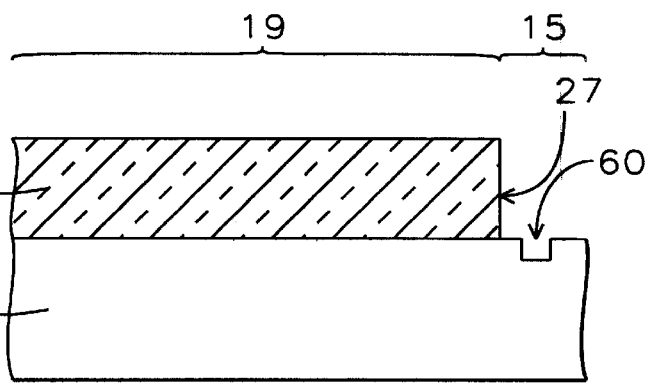
FIG. 7 represents a cross-sectional view of the semiconductor wafer of FIG. 6 taken generally along axis 7—7.

Referring to FIG. 6, in a second embodiment of the present invention, a semiconductor wafer (11) is provided having a marking area (15) located at the edge of the wafer, and a device area (19). The semiconductor wafer (11) has a silicon top surface in the marking area (15). A photoresist layer (20) is formed on the semiconductor wafer (11). Then, as shown in FIG. 6, the photoresist layer (20) is patterned to form an opening (27 in FIG. 7) over the marking area (15), thereby exposing the silicon top surface in the marking area (15). The opening preferably has a width of between about 5 microns and 100 microns. FIG. 7 shows a cross-sectional view of the semiconductor wafer (11) taken generally along axis 7—7.

Referring to FIG. 7, a volume of the silicon top surface of the semiconductor wafer (11) is removed through the opening (27) in the photoresist layer (20) using a laser scribing technique to form a laser mark (60). The photoresist layer (20) acts as a mask protecting the device area (19) from contamination by silicon particles generated by the laser scribing technique.

The photoresist is then stripped as in the first embodiment, leaving a wafer with a marking pattern in the marking area, and free from contamination by silicon particles in the device area.

The key advantage of the present invention is that a semiconductor wafer can be marked using a laser scribing technique, without inducing edge particle defects. Also, the method of the present invention is economical, robust, and can be easily incorporated into current semiconductor manufacturing processes.

While the invention has been particularly shown and described with reference to the preferred embodiments thereof, it will be understood by those skilled in the art that various changes in form and details may be made without departing from the spirit and scope of the invention.

What is claimed is:

1. A method for marking a semiconductor wafer without inducing flat edge particles, comprising the steps of:
   a. coating a semiconductor wafer with a layer of photoresist; said semiconductor wafer having a marking area with a silicon top surface;
   b. removing a volume of said photoresist layer corresponding to the intended wafer marking using a laser scribing technique; thereby forming a laser marking trench exposing said silicon top surface;
   c. etching said silicon top surface through said laser marking trench in said photoresist layer; and
   d. removing said photoresist layer.

2. The method of claim 1 wherein said photoresist layer has a thickness of between about 1000 Angstroms and 100,000 Angstroms.

3. The method of claim 1 wherein a volume of said photoresist layer is removed using a laser scribing technique at a power setting sufficient to completely remove the photoresist corresponding to the intended marking pattern without removing the underlying silicon top surface of the semiconductor wafer.

4. The method of claim 2 wherein a volume of said photoresist layer is removed using a laser scribing technique at a power setting sufficient to completely remove the photoresist corresponding to the intended marking pattern without removing the underlying silicon top surface of the semiconductor wafer.

5. The method of claim 1 wherein said laser mark trench is etched to a depth of between about 2000 Angstroms and 100,000 Angstroms using a wet etch or reactive ion etch process.

6. The method of claim 5 wherein said laser mark trench is etched to a depth of between about 2000 Angstroms and 100,000 Angstroms using a wet etch or reactive ion etch process.

7. A method for marking a semiconductor wafer without inducing flat edge particles, comprising the steps of:
   a. coating a semiconductor wafer with a layer of photoresist; said semiconductor wafer having a marking area with a silicon top surface; said semiconductor wafer is composed of solid crystalline Si, or solid crystalline Ge; said semiconductor wafer is used in integrated circuit manufacturing;
   b. removing a volume of said photoresist layer and a volume of said silicon top surface corresponding to the intended wafer marking using a laser scribing technique; thereby forming a laser mark trench in said photoresist layer and said in silicon top surface; said intended wafer marking is a mark used to identify the wafer during semiconductor manufacturing; and
   c. removing said photoresist layer.

8. The method of claim 7 wherein said laser mark trench is formed to a depth of between about 2000 Angstroms and 100,000 Angstroms in said silicon top surface using a laser scribing technique.

9. A method for marking a semiconductor wafer without inducing flat edge particles, comprising the steps of:
   a. providing a semiconductor wafer; said semiconductor wafer having a marking area with a silicon top surface;
   b. forming a layer of photoresist layer on said semiconductor wafer;
   c. patterning said photoresist layer to form an opening over said marking area;
   d. removing a volume of said silicon top layer corresponding to the intended wafer marking using a laser scribing technique to form a laser mark trench; and
   e. removing said photoresist layer.

10. The method of claim 9 wherein said photoresist layer has a thickness of between about 1000 Angstroms and 100,000 Angstroms.

11. The method of claim 9 wherein said opening has a width of between about 5 microns and 100 microns.

12. A method for marking a semiconductor wafer without inducing flat edge particles, comprising the steps of:
   a. coating a semiconductor wafer with a layer of photoresist; said semiconductor wafer having a marking area with a silicon top surface; said semiconductor wafer is composed of solid crystalline Si of solid crystalline Ge;
   b. removing a volume of said photoresist layer corresponding to the intended wafer marking using a laser scribing technique; thereby forming a laser marking trench exposing said silicon top surface; said intended wafer marking is a mark used to identify the wafer during semiconductor manufacturing; said laser marking trench not extending through the entire top Silicon surface;
   c. etching said silicon top surface through said laser marking trench in said photoresist layer; and
   d. removing said photoresist layer.

13. A method for marking a semiconductor wafer without inducing flat edge particles, comprising the steps of:
   a. coating a semiconductor wafer with a layer of photoresist; said semiconductor wafer having a marking area with a silicon top surface; said semiconductor wafer is composed of a material selected from the group consisting of Si, and Ge; said semiconductor wafer is used in integrated circuit manufacturing; said semiconductor wafer not used in Solar cell fabrication;
   b. removing a volume of said photoresist layer and a volume of said silicon top surface corresponding to the intended wafer marking using a laser scribing technique; thereby forming a laser mark trench in said photoresist layer and said in silicon top surface; said intended wafer marking is a mark used to identify the wafer during semiconductor manufacturing; said laser mark trench is formed to a depth of between about 2000 Angstroms and 100,000 Angstroms in said silicon top surface; and
   c. removing said photoresist layer.

14. A method for marking a semiconductor wafer without inducing flat edge particles, comprising the steps of:
   a. providing a semiconductor wafer having a marking area; said semiconductor wafer being composed of monocrystalline silicon;
   b. forming a photoresist layer on said semiconductor wafer;
   c. patterning said photoresist layer to form an opening over said marking area while leaving active areas of said semiconductor wafer covered by said photoresist layer; said opening having a width of between about 5 microns and 100 microns;
   d. removing a volume of said monocrystalline silicon corresponding to a wafer identification mark from said marking area of said semiconductor wafer using a laser scribing technique to form laser mark trenches; and
   d. removing said photoresist layer.

* * * * *